United States Patent [19]

Popoff

[11] 4,350,555
[45] Sep. 21, 1982

[54] PRECISION LAMINATING PRESS

[75] Inventor: Andrew Popoff, Mountain Lakes, N.J.

[73] Assignee: Keuffel & Esser Company, Morristown, N.J.

[21] Appl. No.: 168,235

[22] Filed: Jul. 10, 1980

[51] Int. Cl.³ .................. B32B 31/00; B44C 1/00; B65H 25/00; B41D 7/00

[52] U.S. Cl. ................... 156/540; 156/240; 156/299; 156/582; 156/391; 156/368; 101/33

[58] Field of Search ............... 156/541, 540, 555, 241, 156/240, 584, 368, 552, 391, 558, 576, 582; 101/33, 220, 221, 222, 230, 231, 34, 426, 415.1; 430/293, 22; 427/144

[56] References Cited

U.S. PATENT DOCUMENTS 2,733,655  2/1956  Boni ............................ 427/144
2,859,691  11/1958 Heller .......................... 101/221
3,404,057  10/1968 Heiart .......................... 156/584
3,453,165  7/1969  Isbey et al. .................. 156/241
3,732,815  5/1973  Greiner et al. ............... 101/220

FOREIGN PATENT DOCUMENTS 1966986  2/1976  Fed. Rep. of Germany ...... 101/221

Primary Examiner—Edward C. Kimlin
Assistant Examiner—Louis Falasco
Attorney, Agent, or Firm—Lionel N. White

[57] ABSTRACT

A press apparatus comprising a pair of parallel rollers sequentially joins a plurality of pre-imaged adhesive layers in precise registration to form a composite color proof. Detent and coupling means maintain the respective rollers and mounted image sheets in predetermined registration until the rollers are brought together and rotated by separate drive means to effect lamination of the complementary imaged layers.

9 Claims, 8 Drawing Figures

PRECISION LAMINATING PRESS

BACKGROUND

The present invention relates to apparatus for registering and combining a pair of flexible sheets in face-to-face adhesive contact. This apparatus is particularly useful in the graphic arts field for the construction of composite multilayer prints, such as the colorproofing surprints described in copending U.S. Patent Application Ser. No. 795,339.

In that colorproofing process a series of separated color images are prepared on individual carrier sheets and the imaged adhesive layers of those sheets are then transferred to a single receptor sheet, one upon another, in precise register. While other colorproofing systems transfer photosensitive layers to a receptor sheet prior to in-register light exposure through a color separation negative, and thus have no need for the maintenance of register during a laminating operation, the transfer of an imaged layer in the above-noted process has created a demand for the precision laminating press of the present invention.

SUMMARY

The press apparatus of the present invention comprises a pair of rollers upon the respective ones of which are mounted a receptor sheet and an image sheet having a pressure-sensitive adhesive layer bearing an image in one of a set of colorproofing colors. Means such as register pins are used to temporarily locate the image sheet precisely upon its roller. The receptor sheet, on the other hand, is firmly fixed to its roller surface, since, unlike the plurality of image sheets which are processed in sequence, the receptor sheet remains on the press throughout the proofing process.

With the respective sheets thus mounted on the roller pair the rollers are circumferentially aligned with respect to the registered position of the image sheet by means of detent and kinematic coupling elements and are brought together under substantial pressure by first drive means, thereby establishing a precisely located initial adhesive bonding between the image and receptor sheet surfaces. At least one of the pair of rollers is then rotated by second drive means so as to draw the image and receptor sheets into the pressure nip of the apparatus and progressively adhere the imaged layer to the receptor sheet.

Upon completion of the lamination, the first drive means reverses to separate the rollers and the image sheet carrier is removed from the imaged layer, thereby depositing the image of the first color on the receptor sheet. Image sheets of the second and subsequent colors are likewise precisely located on the registration roller, each in its turn, and the imaged layers are transferred to the receptor sheet composite to form the colorproof surprint. The apparatus may thereafter be used to laminate the multi-color proof to a final display sheet of any desired stock of paper, film, foil, or the like.

A series of interacting controls are provided in the apparatus to ensure complete pressure engagement between the rollers before any laminating advancement of the sheets can take place. These controls further provide a significant degree of safety for the operator during the processing of the various sheets.

DRAWINGS

DESCRIPTION

Figure 1:
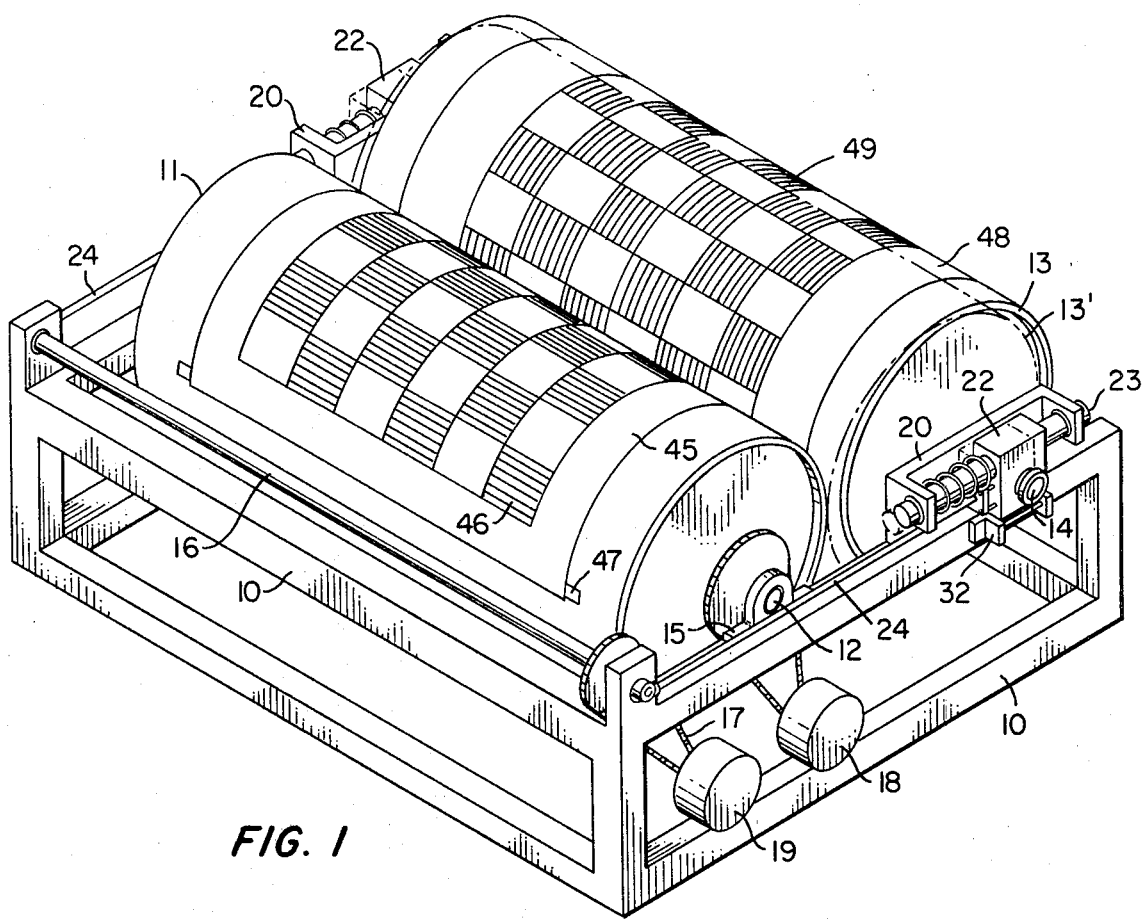
FIG. 1 is a right rear perspective view of a laminating press according to the present invention.

As generally depicted in FIG. 1, an embodiment of the laminating press comprises a frame 10 supporting a pair of drums or rollers 11, 13, which are mounted on parallel axles 12, 14. Axle 12 of roller 11 is journaled in pillow blocks 15 fixed to frame 10, thereby permanently locating roller 11 with respect to frame 10. Roller 13, on the other hand, has its axle 14 journaled in bearing blocks 22 which are affixed to shafts 23, arranged for longitudinal movement in linear bearings 21 of supports 20 affixed to frame 10. By this longitudinal movement of shafts 23 with bearing blocks 22, roller 13 may be positioned away from or into surface contact with roller 11 as at 13'.

With rollers 11, 13 in the separated, or open, position, receptor and image sheets 45, 48 may be readily mounted on their respective rollers as will later be more particularly described. To facilitate the mounting of these sheets, axle 14 of roller 13 is arranged to normally turn freely in bearing blocks 22, while drive means 18 of roller 11 includes a normally-disengaged electromechanical clutch mechanism to likewise allow freewheeling of axle 12 in its bearings.

Figure 2:
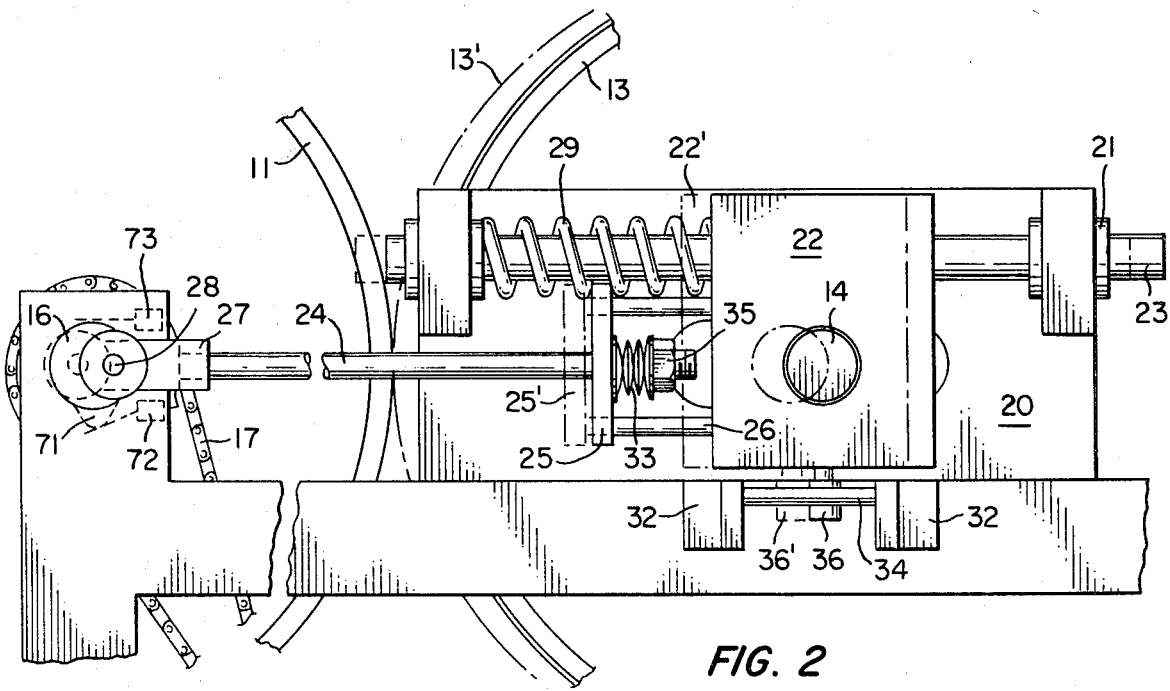
FIG. 2 is a partial right side elevation view of the apparatus of FIG. 1 showing the closing operation thereof.

With sheets 45, 48 thus in position, roller 13 is brought into contact with roller 11 by means of the closure mechanism shown in FIG. 1, and in greater detail in FIG. 2, in which a shaft 16 is journaled in bearing means in frame 10 and extends across the width of rollers 11, 13, generally paralleling shafts 12, 14. From each end of shaft 16 there extends a stud 28 which is located eccentric to the axis of the shaft. Journaled on each of these studs 28 are bearing means 27 to which are affixed pull rods 24 of sufficient length to extend through plates 25 which are firmly affixed to respective bearing blocks 22 by means of studs or standoff bolts 26. The operative connection between pull rods 24 and plates 25 is effected through compression washer stacks 33 and adjustment nuts 35 engaging the threaded ends of pull rods 24. By means of nuts 35 the contact pressure between roller 11, 13 may be adjusted as desired while the rollers are in the contacting closed position.

Roller 13 with its axle 14 in bearing blocks 22, supported on shafts 23 as earlier noted, is normally urged to its open position 13, as depicted in FIG. 2, by the action of compression springs 29. Roller bearing studs 36 extending downward from bearing blocks 22 are closely confined between parallel rods 34 extending between brackets 32 affixed to frame 10 and maintain the perpendicularly of bearing blocks 32. First drive means 19 incorporating a reversible motor and electromechanical brake is mounted on frame 10 and operatively connected through sprocket and chain means 17 to effect rotation of shaft 16.

Operation of the closing mechanism, which brings the image sheet roller to its closed position 13' in contact with roller 11, comprises actuation of drive means 19 to initiate rotation of axle 16 in the clockwise direction, as viewed in FIG. 2, with resulting displacement of rod end bearings 27 in the direction away from bearing blocks 22. This action is transferred through pull rods 24 to displace plates 25 and bearing blocks 22 to their indicated positions 25', 22' with the resulting contact between the surfaces of rollers 11, 13'.

Rotating with shaft 16 is cam 71 which, having initially operated to close switch 72 to enable the roller closing operation, as will be more particularly described later, proceeds to open the contacts of switch 73 after 180° of rotation to halt and brake drive means 19 after displacement of studs 28 and connected closure mechanism through the maximum available distance. At this stage in the operation of the press the surfaces of receptor and image sheets 45, 48 are in firm initial contact along the line of circumferential tangency of rollers 11, 13.

Figure 3:
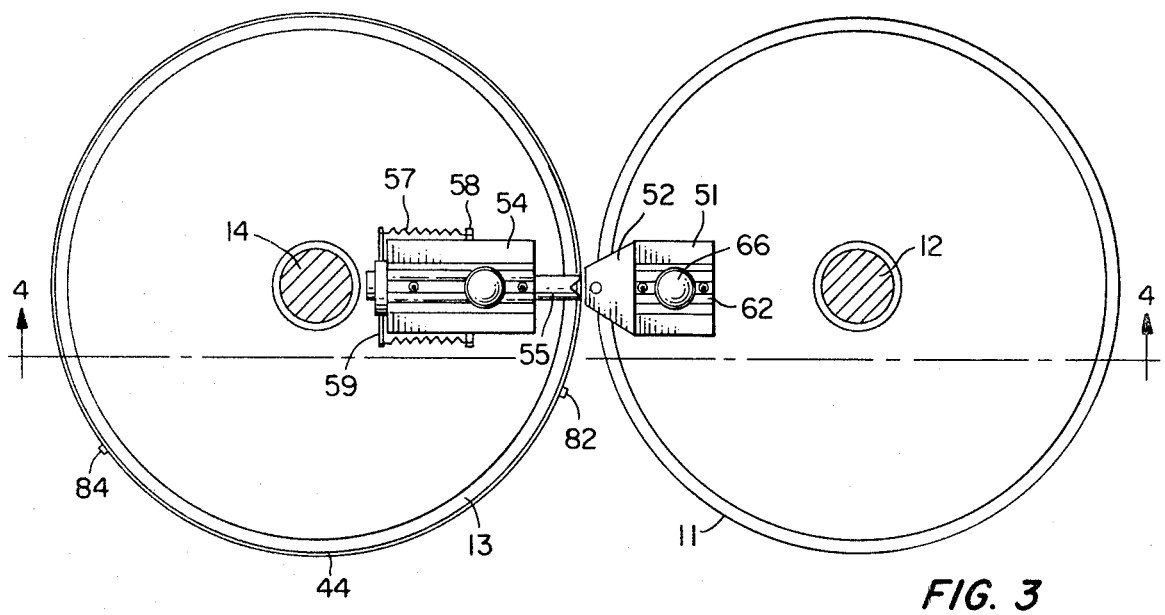
FIG. 3 is a left side elevation view in partial section taken along the line 3—3 of FIG. 4 showing detent and coupling alignment means.
Figure 4:
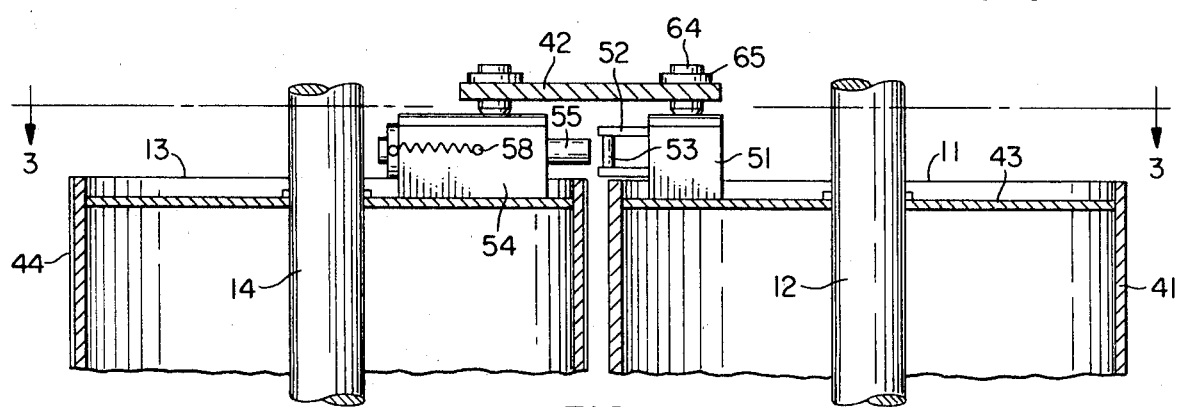
FIG. 4 is a sectional plan view taken along the line 4—4 of FIG. 3 presenting another view of the detent and coupling means.

In view of the fact that the above-noted colorproofing surprint construction entails the consecutive adhesive transfer of a plurality of colored images to the receptor sheet, it is essential that the initial line of contact between such receptor sheet and each image sheet surface be precisely located with respect to the registration datum of the composite image. Such a result therefore requires that rollers 11, 13 be in precisely the same circumferential relationship during each successive closing operation. This precise alignment is ensured by means of the detent and coupling mechanisms depicted in FIGS. 3–6. As shown generally in FIGS. 3–4, these registering mechanisms are affixed to adjacent end faces of rollers 11,13 and interreact to hold each of these rollers in a precise position with respect to rotational displacement about their respective axles.

Figure 6:
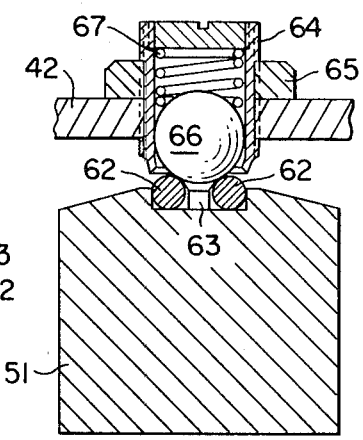
FIG. 6 is an elevation view in section taken along the line 6—6 of FIG. 5.

The initial positioning of the rollers 11, 13 is accomplished through the use of detent means, such as detailed in FIG. 6. A body block 51 firmly affixed to the end face 43 of roller 11 has along its top surface a groove element situated parallel to the radius of the roller. In the present embodiment this groove element is simply constructed by means of a pair of parallel rods 62 which are held in a slot in the top of body 51 by the shoulder portion of bolts 63. A plate 42 affixed to frame 10 supports a ball detent element in position to cooperate with the groove portion of block 51. This detent element comprises an externally threaded tube 64 in which is encaged a ball 66 arranged to partially protrude from tube 64 under the urging of compression spring 67. The clearance between rod elements 62 and the end of tube 64 is adjusted by means of the threaded engagement between the tube and plate 42, and the ball detent assembly is then firmly locked in place by means of nut 65. In operation, rotation of roller 11 in its freewheeling condition is effected by hand to bring block 51 into position where rods 62 are astride and in contact with ball 66. In this manner roller 11 is prevented from rotation by the action of spring 67.

Similar detent means are provided roller 13 and include body block 54 having a radially positioned rod pair assembly 62, 63 which cooperate with a second ball detent element extending from plate 42. Arrangement of the groove member of each detent means, particularly that of roller 13 substantially parallel to the roller radius allows for continued operation of the detent to prevent rotation of the rollers even during the closing movement of roller 13 into contact with roller 11.

The described detent means are not, however, sufficiently precise, due to the tolerance between ball 66 and tube 64 for example, to effect the close alignment of rollers 11, 13 required to maintain the necessary registration of the sheets mounted on these rollers. The invention therefore provides a coupling assembly which becomes active during the closing operation to hold the rollers in relative position which is repeatable to within about 0.25 mm. In the present embodiment this secondary alignment assembly comprises a first subassembly which includes a pair of tongue elements 52 extending from block 51 and supporting between them a pin element 53 with its axis situated parallel to axle 12 and substantially centered on the groove element of block 51, and a second cooperating subassembly which comprises a shaft 55 journaled in a linear bearing in block 54.

Figure 5:
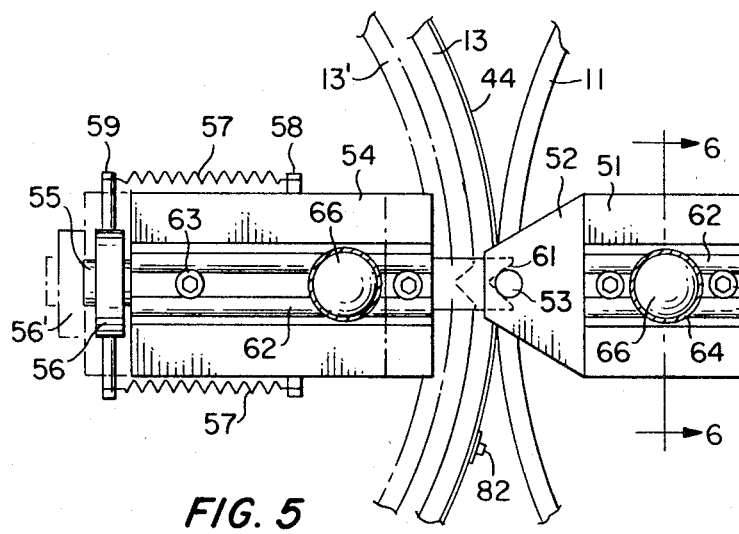
FIG. 5 is an enlarged portion of the view of the detent and coupling means shown in FIG. 3.

The axis of shaft 55 substantially parallels the groove element of block 54 and its proximal end comprises a transverse V-groove 61 of sufficient size to engage pin 53, as shown in FIG. 5. The distal end of shaft 55 is encircled by a collar 56 which is adjustably positioned along shaft 55. Stud elements 58, 59 extend respectively from body 54 and collar 56 and anchor the ends of a pair of tension springs 57. Under the urging of these springs 57, shaft 55 is normally extended toward pin 53 during the open cycle of rollers 11, 13 with collar 56 in contact with block 54, such as at position 56' in FIG. 5, to determine the degree of such extension of shaft 55 and the ultimate force developed by springs 57.

Operation of this secondary alignment means is shown in FIG. 5 which depicts roller and collar members in their respective open stage positions 13', 56' and in their subsequent closed stage position 13, 56. During the closure operation, block 54 moves with its carrying roller 13 to bring the V-groove end of shaft 55 into contact with pin 53, the extension of shaft 55 being adjusted so that initial contact between groove 61 and pin 53 occurs prior to surface contact between rollers 11, 13. Further and final movement in the closure operation thereafter comes under the influence of tension springs 57 as block 54 continues moving with roller 13 while the end of shaft 55 is held stationary against pin 53. Since the exact alignment of the detent groove elements on a line extending between the axes of axles 12, 14 usually cannot be practially achieved during apparatus assembly, it is preferred that these elements be intentionally displaced or inclined slightly from such line in order to ensure coupling of V-groove 61 and pin 53 at a predetermined point likewise displaced from that line, thereby injected a transverse force vector which imparts a minute rotation of rollers 11, 13 in the given direction to consistently absorb the noted tolerances and override any other variables inherent in the detent and roller support assemblies. Thus, at the time of actual contact between rollers 11, 13 their alignment is governed by the precise kinematic arrangement effected by the coupling of shaft 55 and pin 53 under the urging of springs 57. In this manner the registration between the roller surfaces and their respective sheets is repeatedly accomplished.

After such establishing of the initial line of adhesive contact between sheets 45, 48, reproducible registration from sheet to sheet in the composite image transfer procedure is dependent upon the mechanics of the roller assemblies. However, since each image lamination begins at exactly the same contact line, any mechanical errors are precisely reproduced during the laminating action of the rollers and the required consistent registration is maintained.

The subsequent lamination operation is initiated by actuation of second drive means 18 which causes rotation of roller 11 and consequent rotation of contacting roller 13. Upon commencement of the roller rotation cycle, the urging of springs 67 of the ball detent assemblies is overridden and blocks 51, 54 released for movement with their respective rollers. Simultaneously the surfaces of pin 53 and groove 61 of the coupling assembly move out of contact. Rotation of the rollers is then continued until all of the design area of sheets 45, 48 have been brought into pressure contact at the nip of the rollers. Drive means 18 is thereupon deactivated to end roller rotation, and drive means 19 is actuated in reverse direction to effect the roll opening operation.

Figure 7:
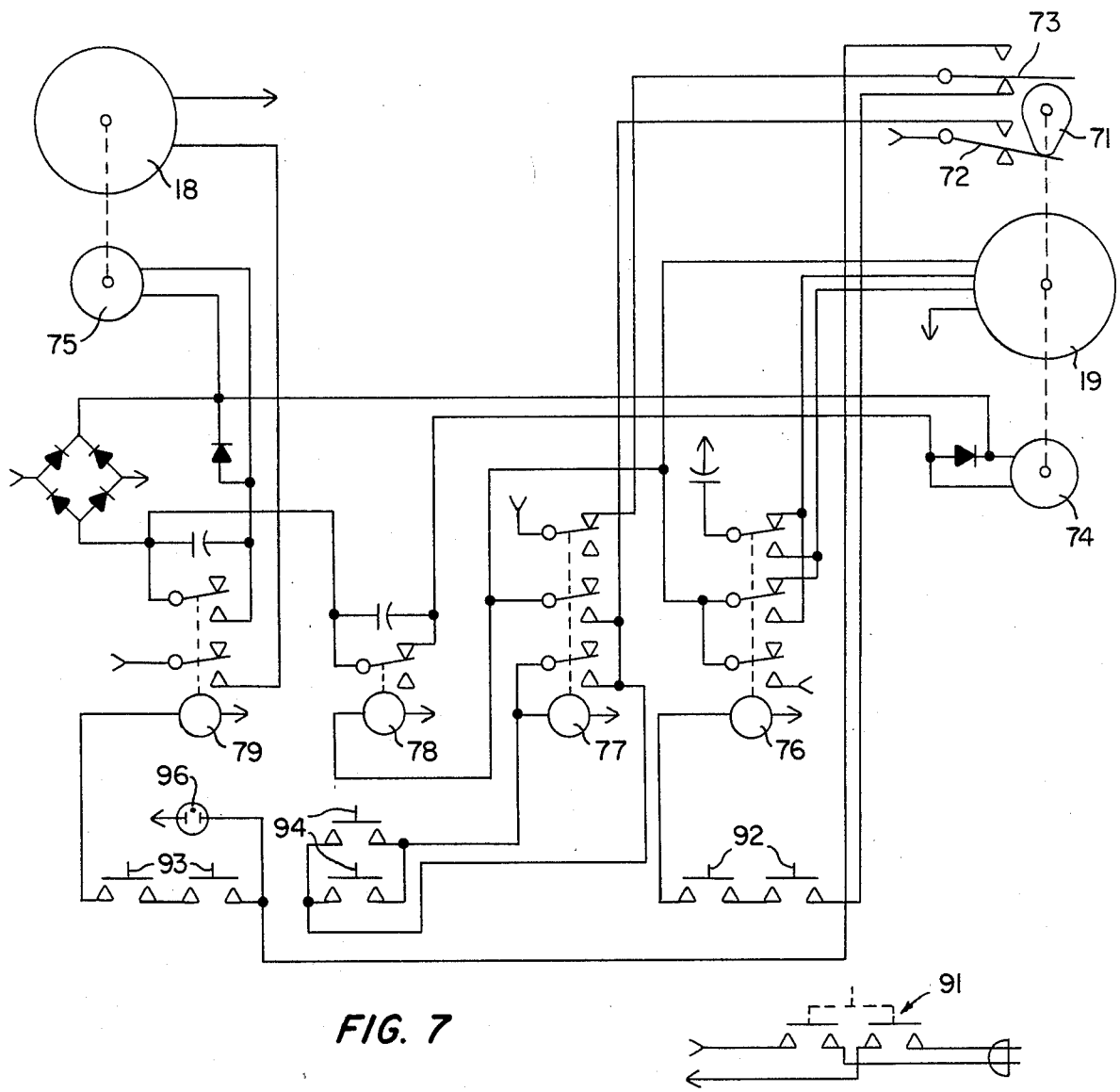
FIG. 7 is a schematic of the controls for the embodiment of the apparatus shown in FIG. 1.

The control circuitry of the present embodiment may be seen in the schematic of FIG. 7 which depicts first drive means 19 as motor 19 mechanically coupled to cam 71 and electromechanical brake 74, and second drive means 18 as motor 18 mechanically coupled to electromechanical clutch 75. In addition to the indicated conductors, protective diodes and condensors, and rectifier, the circuitry includes relays 76-79, switches 91-94, and signal lamp 96. Switch 91 is the main power ON/OFF switch interposed between the line plug and the various indicated junctions in the conductor wiring harness. Switches 92-94 are normally-open, to be depressed by the operator during the various operating cycles of the apparatus.

As shown in FIG. 7 the control circuitry is in that condition which exists when the rollers of the press are in fully opened position. Cam 71 holds normally-closed switch 72 in open position while switch 73 is allowed to contact its first pole, as shown, enabling relay 76 for actuation through normally-open switches 92 which, as a safety feature, are wired in series and widely spaced on the apparatus so as to require the action of both hands of the operator. Relay 77 is in its inactive state and completes the enabling of relay 76 for actuation through switches 92. Relay 78 is inactive with its swich closing the circuit to actuate brake 74, preventing any movement of the closure mechanism. Relay 79 is inactive with its switches open, allowing clutch 75 to be normally disengaged.

With sheets 45, 48 in position on the rollers, as will later be described in greater detail, the operator initiates the CLOSE cycle by depressing switches 92 to actuate relay 76 whose switches set the polarity of motor 19 to the forward, or CLOSE mode, and additionally complete the line circuit to provide running current to operate motor 19 and begin the CLOSE cycle. This relay switch closing also provides power to actuate relay 78 which causes its switch to open, causing brake 74 to disengage.

The CLOSE cycle continues as long as switches 92 are depressed or until shaft 16 has been rotated and eccentric studs 28 displaced 180° and full contact between rollers 11, 13 completed. At that point cam 71 causes the contact of switch 73 to be moved to its second pole, thereby opening the circuit to relay 76, resulting in the breaking of the power circuit to motor 19 and relay 78, deactivation of the latter causing brake 74 to engage and immobilize the closure mechanism. This contact at the second pole of switch 73 closes the power circuit through signal lamp 96 to indicate completion of the CLOSE cycle and the enabling of relay 79 for actuation through switches 93. Controlling the operation of motor 18 and the ROTATE cycle, normally-open switches 93 are in series to provide operator protection in the manner of switches 92.

Rotation of rollers 11, 13 to effect lamination of sheets 45, 48 is initiated by the operator's depression of switches 93 to actuate relay 79 with resulting engagement of electromechanical clutch 75 and operation of motor 18. The ROTATE cycle may thus be continued until design images 46, 49 have been brought into contact over their entire length. Release of switches 93 terminates the ROTATE cycle.

At the commencement of the CLOSE cycle, movement of cam 71 with that of motor 19 allows switch 72 to close the line circuit to enable the actuation of relay 77 by means of either of normally-open switches 94 which, as a further safety measure, are wired in parallel in order that any one may be operative upon a momentary touch. When separation of rollers 11, 13 is desired, either at the completion of the laminating procedure or in an emergency situation, the operator depresses any of switches 94 to actuate relay 77 and commence to OPEN cycle. One switch of relay 77 is in parallel with switches 94 and, once closed, serves to maintain the OPEN cycle until completion upon the opening of switch 72 by cam 71. Actuation of relay 77 also ensures disabling of relay 76 which, in its inactive state, effects reversal of the polarity of motor 19 to the OPEN mode. Closing of the remaining switch of relay 77 energizes motor 19 and relay 78 to release brake 74 and allow rotation of shaft 16 with resulting separation of rollers 11, 13.

As described in the aforementioned copending patent application, the colorproofing process for which the instant laminating press is particularly adapted comprises the formation of a plurality of complementary images on separate sheets by means of light exposure through color separation negatives followed by selective removal of protective overlayers and application of different powder pigment colors to the imagewise revealed pressure-sensitive adhesive underlayers. The remaining protective overlayers of the sheets are then removed to yield the colored powder images set in a background of pressure-sensitive adhesive on the surface of each of the image sheets which are represented in the accompanying drawings by sheet 48. A receptor sheet 45 of paper, or of film, preferably with a layer of pressure-sensitive adhesive, is brought into face-to-face adhesive contact with a first image sheet by means of the apparatus of the present invention. The film sheet carrier of image sheet 48 is then peeled away from the composite leaving its image layer deposited on receptor sheet 45. The process is then repeated with each remaining image sheet 48; however, these successive laminations must be accomplished under precise registration control as provided by the present laminating press.

Figure 8:
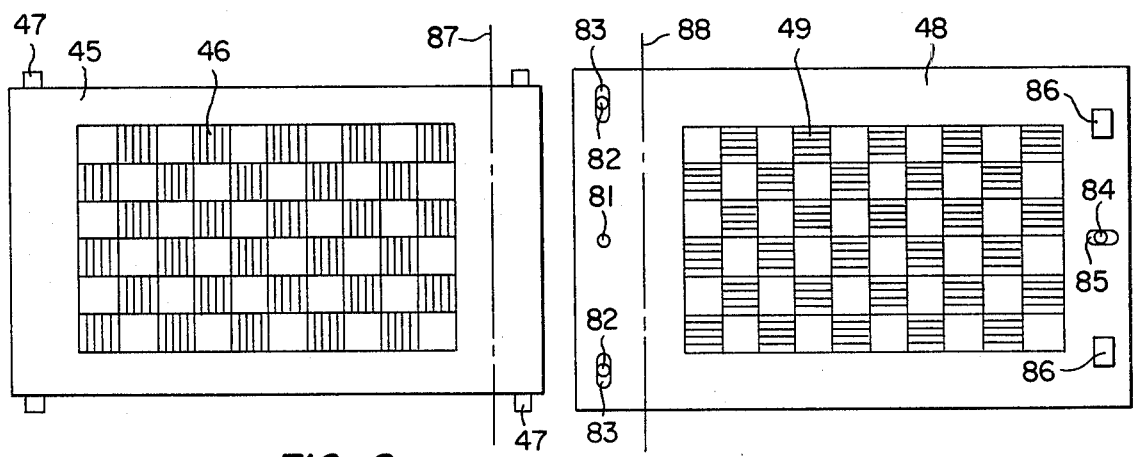
FIG. 8 is a representative plan view of a pair of imaged sheets showing their relative positions during processing on a laminating press of the present invention.

Referring to the drawings, FIGS. 1 and 8 depict the present apparatus being utilized at this stage in the preparation of a colorproofing surprint, that is to say, at the stage where a first color image, represented simply as a cyan checkerboard design 46, has been transferred to receptor sheet 45 and a second, magenta checkerboard design 49 is about to be transferred from its carrier sheet 48 to form a composite cyan/magenta checkerboard design. In FIG. 8 sheets 45, 48 are shown in two dimensions for greater clarity; however, it should be borne in mind that these sheets are actually mounted on rollers 11, 13 as depicted in FIG. 1.

At the outset of the process a plain receptor sheet 45 is firmly attached to the surface of roller 11 by any desired means, such as the indicated simple strips of double-faced pressure-sensitive adhesive tape 47. In order to provide consistent conditions throughout the entire laminating process, the initial mounting of receptor sheet 45 is preferrably conducted in a machine laminating step. A first strip of tape 47 is therefore applied to roller 11, or receptor sheet 45, and the entire sheet run through a laminating cycle in the apparatus until the trailing edge is fully contacted with the second strip of tape 47. It has been found that in this manner receptor sheet 45 is properly stretched and positioned on roller 11 so as to respond consistently during each subsequent laminating cycle.

Mounting of an image sheet 48 on roller 13 entails the use of temporary mounting means, since, as previously described, the entire sheet is transferred to the receptor sheet and the carrier thereafter removed from the imaged adhesive layer. A system of register pins affixed to the surface of roller 13 and precisely punched holes and slots in the image sheets has been found to be particularly satisfactory as the registration and mounting means for the instant processing. A preferred punched hole arrangement is shown in FIG. 8 and comprises a center leading edge hole to closely receive register pin 81, a pair of lateral slots 83 near the longitudinal edges of image sheet 48 sized to closely receive register pins 82 across their width dimension, and the longitudinal slot 85 at the center of the trailing edge of sheet 48 sized to closely receive register pin 84 across its width dimension. This arrangement provides for ready mounting of sheets 48, yet establishes precisely and repeatedly the initial line of contact, represented at 87, 88, between receptor sheet 45 and each image sheet 48.

An economical roller structure comprises a cylinder 41 of rigid material, such as steel, to which are affixed end plates 43 mounted on a central axle shaft 12. These basic structures may be produced in quantity and machined to standard diameter in order to simplify subsequent assembly. Despite the natural rigidity and strength of the cylinder material, however, some flexing of the rollers is experienced under the laminating pressures developed in the apparatus. Therefore, in order to compensate for such flexing, as well as to fill any surface voids or imperfections such as machining striations, and ensure complete expulsion of air from between sheets 11, 13 during lamination, it is preferred that the surface of at least one of the roller cylinders be covered with a smooth, resilient layer 44 of rubber, plastic, or the like. Commercially available, self-adherent printing blanket material has been found to serve quite well in this role.

Although the material of layer 44 is of no more than one or two millimeters in thickness, the resulting difference between the respective diameters of rollers 11, 13 acting in concert with the compression and deformation of layer 44 at the nip of the contacting rollers creates a condition in which image sheet 48, once having been adhesively attaching via receptor sheet 45 to driving roller 11, is drawn through the nip at a rate which exceeds the rate of travel of the surface of roller 13. As a result, image sheet 48 moves forward with respect to the movement of roller 13 when the diameter of that roller is greater than the diameter of roller 11. It is preferable to utilize this relationship in diameter size in order to ensure that noted forward relative displacement of sheet 48 which may be accommodated by the longitudinal disposition of slot 85 at the trailing edge of the sheet.

Transfer of a second checkerboard pattern 49 in registration with first pattern 46 previously transferred to receptor sheet 45 proceeds in the following manner. With both rollers 11, 13 being in freewheeling condition due to the disengagement of the clutch and brake elements of the respective drive means 18, 19 as previously described, the operator rotates the rollers to those respective positions where detent balls 66 are received between respective rod pairs 62. Sheet 48 which has been previously punched and processed to provide image 49 is mounted on roller 13 by engaging the respective register pins in the appropriate holes or slots as shown in FIG. 8. It has been found that a useful means for retaining the traling edge of sheet 48 in surface contact with roller 13, while allowing the procession of that sheet over the surface of layer 44, comprises one or more magnets 86. These magnets are selected to be of such a size as to provide a sliding resistance of but a few grams which is effective to provide sufficient tension to hold sheet 48 smoothly upon the roller surface.

With sheet 48 thus positioned on roller 13 the operator initiates the CLOSE cycle of the apparatus, as earlier-described, to establish the precisely registered line contact between the sheet surfaces along representative lines 87, 88. The sheets being thus firmly engaged, the operator releases the leading edge of sheet 48 from pins 81, 82 and initiates the ROTATE cycle of the apparatus. As sheets 45, 48 proceed into the nip between rollers 11, 13 all air is progressively expelled from between those sheets and their adhesive surfaces are forced into initmate contact with the colorant image and each other under the developed pressure which exceeds about 3.5 $g/mm^2$.

After the laminating of the sheets has progressed to a point where the entire image areas have been joined, the operator terminates the ROTATE cycle, removes the holding magnets and disengages sheet 48 from pin 84. The OPEN cycle is then initiated and roller 13 withdrawn from contact with sheet 48 which is now firmly adhered to receptor sheet 45 with its imaged adhesive layer in precise registration upon receptor sheet image 46 to complete the multicolor checkerboard image pattern 46/49. Compositing of the colorproofing image having been completed the operator may simply separate the receptor sheet 45 from retaining tapes 47 to obtain a transparent print, or the carrier sheet, or film, of the final image sheet 48 may be peeled from the laminated adhesive layers and a separate sheet of actual printing stock laminated to the composite image layers in a final pass through the press prior to removal from roller 11 to yield a final surprint proof of a texture and hue which duplicates to an extraordinary degree the product of the printing press.

What is claimed is:
1. A laminating press comprising:
  (a) a frame;

(b) a first roller supported for rotation upon a first axle journaled in bearing means mounted on said frame;

(c) a second roller supported for rotation upon a second axle disposed substantially parallel to said first axle and journaled in bearing means mounted on said frame;

(d) at least one of said first and second bearing means being mounted on said frame for reciprocal movement transverse to the axle of its supported roller and in the plane coincident with the axes of both said rollers to thereby effect relative movement of said rollers into and out of surface contact;

(e) first drive means for imparting said reciprocal movement
  (1) in one direction to effect and maintain said rollers in surface contact, and
  (2) in an opposite direction to effect separation of said rollers, (f) first drive control means for establishing the direction of said reciprocal movement;

(g) alignment means associated with each of said rollers arranged to retain said rollers in precise circumferential alignment prior to the time their respective surfaces come into contact;

(h) registration means associated with at least one of said first and second rollers for temporarily locating a flexible sheet in a precise position on the surface thereof;

(i) holding means associated with the other of said rollers for maintaining a flexible sheet in a fixed position on the surface thereof;

(j) second drive means for imparting rotational movement to at least one of said rollers; and (k) second drive control means for controlling the operation of said second drive means.

2. A press according to claim 1 wherein said alignment means comprises:
  (a) detent means on said frame for engaging each respective one of said rollers and locating preselected circumferential zones of said rollers in juxtaposition when said rollers are out of contact; and
  (b) coupling means associated with each of said rollers arranged to engage during the course of the relative movement of said rollers toward contact and retain said rollers in precise circumferential alignment at least until their respective surfaces come into contact.

3. A press according to claim 2 wherein said coupling means comprises:
  (a) a body member affixed to one of said rollers presenting a first contact element adjacent said circumferential zone of said one roller;
  (b) a body member affixed to the other of said rollers presenting a second contact element adjacent said first contact element and on a line therewith parallel to the direction of said reciprocal bearing movement, thereby ensuring engagement between said elements during said course of relative roller movement;
  (c) means mounting one of said contact elements for reciprocal movement in the direction generally parallel to said bearing movement direction; and
  (d) means urging said one contact element in the direction of the other of said contact elements, thereby providing a force upon engagement of said contact elements which eliminates tolerances in said alignment means prior to roller contact.

4. A press according to claim 3 wherein said contact elements are on a line offset from the plane coincident with the axes of said rollers.

5. A press according to claim 1 wherein said first drive means comprises:
  (a) a motor;
  (b) means for transferring the operating power of said motor to effect said bearing means movement; and
  (c) braking means arranged to immobilize said transfer means except for such time as said motor is energized.

6. A press according to claim 5 wherein said motor is reversible and said drive control means maintains said motor in a condition to move said rollers out of contact except for such time as said motor is selectively energized for movement of said rollers into contact.

7. A press according to claim 1 wherein said second drive means comprises a motor in operating connection with clutch means normally disengaged except for such time as said motor is energized.

8. A press according to claim 1 wherein said second drive control means is disabled except for such time as said rollers are in surface contact, thereby ensuring the maintenance of alignment of said rollers until at least initial registered contact between said sheets mounted thereon.

9. A press according to claim 1 wherein the surface of at least one of said rollers comprises a layer of resilient, elastomeric material.

* * * * *